United States Patent
Huang et al.

(10) Patent No.: US 10,608,113 B1
(45) Date of Patent: Mar. 31, 2020

(54) SEMICONDUCTOR STRUCTURE AND FABRICATION METHOD THEREOF

(71) Applicant: UNITED MICROELECTRONICS CORP., Hsin-Chu (TW)

(72) Inventors: Cheng-Yeh Huang, Tainan (TW); Te-Chang Hsu, Tainan (TW); Chun-Jen Huang, Tainan (TW); Che-Hsien Lin, Taoyuan (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/162,356

(22) Filed: Oct. 16, 2018

(30) Foreign Application Priority Data

Sep. 27, 2018 (TW) .............................. 107134069 A

(51) Int. Cl.
| | |
|---|---|
| *H01L 21/762* | (2006.01) |
| *H01L 29/66* | (2006.01) |
| *H01L 29/78* | (2006.01) |
| *H01L 29/04* | (2006.01) |
| *H01L 29/10* | (2006.01) |
| *H01L 21/324* | (2006.01) |
| *H01L 29/51* | (2006.01) |
| *H01L 29/49* | (2006.01) |
| *H01L 21/768* | (2006.01) |
| *H01L 29/161* | (2006.01) |

(52) U.S. Cl.
CPC ........ *H01L 29/7851* (2013.01); *H01L 21/324* (2013.01); *H01L 21/76805* (2013.01); *H01L 29/04* (2013.01); *H01L 29/1079* (2013.01); *H01L 29/161* (2013.01); *H01L 29/4966* (2013.01); *H01L 29/51* (2013.01); *H01L 29/66795* (2013.01)

(58) Field of Classification Search
CPC . H01L 29/785; H01L 29/165; H01L 29/7848; H01L 29/161; H01L 29/7858; H01L 21/02532; H01L 21/845; H01L 21/0245; H01L 2224/05166; H01L 21/02592; H01L 21/324; H01L 21/823814; H01L 29/1054; H01L 29/665; H01L 45/1233; H01L 2224/03
See application file for complete search history.

(56) References Cited

U.S. PATENT DOCUMENTS

2006/0014366 A1* 1/2006 Currie ............... H01L 21/76254 438/517
2019/0165124 A1* 5/2019 More .................... H01L 29/665

* cited by examiner

*Primary Examiner* — Caridad Everhart
(74) *Attorney, Agent, or Firm* — Winston Hsu

(57) ABSTRACT

A semiconductor structure includes a semiconductor substrate, at least a silicon germanium (SiGe) epitaxial region disposed in the semiconductor substrate, and a contact structure disposed on the SiGe epitaxial region. The contact structure includes a titanium nitride (TiN) barrier layer and a metal layer surrounded by the TiN barrier layer. A crystalline titanium germanosilicide stressor layer is disposed in the SiGe epitaxial region and between the TiN barrier layer and the SiGe epitaxial region.

19 Claims, 3 Drawing Sheets

SEMICONDUCTOR STRUCTURE AND FABRICATION METHOD THEREOF

CROSS REFERENCE TO RELATED APPLICATION

This application claims the benefit of Taiwan patent application No. 107134069, filed on Sep. 27, 2018, the disclosure of which is incorporated herein in its entirety by reference.

BACKGROUND OF THE INVENTION

1. Field of the Invention

The present invention relates to the field of semiconductor technology, and more particularly to a semiconductor structure and a method of fabricating the same.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. As the size of the device becomes smaller, the influence of the contact resistance at the interface between the source/drain contact and the source/drain on the electrical properties (such as on-current Ion) of the device becomes more significant. Therefore, the related industries continuously endeavor to improve the related materials and structures for reducing the contact resistance between the source/drain contact and the source/drain as much as possible, so as to satisfy device requirements and enhance device performances.

SUMMARY OF THE INVENTION

The present invention provides an improved semiconductor structure and method of fabricating the same that reduces contact resistance between the source/drain contact and the source/drain and can improve device performance.

According to one aspect of the invention, a semiconductor structure includes a semiconductor substrate, at least a silicon germanium (SiGe) epitaxial region disposed in the semiconductor substrate, and a contact structure disposed on the SiGe epitaxial region. The contact structure includes a titanium nitride (TiN) barrier layer and a metal layer surrounded by the TiN barrier layer. A crystalline titanium germanosilicide stressor layer is disposed in the SiGe epitaxial region and between the TiN barrier layer and the SiGe epitaxial region.

According to another aspect of the invention, a method for forming a semiconductor structure is disclosed. A semiconductor substrate is provided. At least a silicon germanium (SiGe) epitaxial region is formed in the semiconductor substrate. A dielectric layer is deposited over the SiGe epitaxial region and the semiconductor substrate. A contact hole is formed in the dielectric layer. The contact hole exposes a part of the SiGe epitaxial region. Germanium dopants are implanted into the SiGe epitaxial region through the contact hole thereby forming an amorphous SiGe region at a bottom of the contact hole. A TiN barrier layer is conformally deposited on an interior sidewall and the bottom of the contact hole. An annealing process is performed to transform at least a part of the amorphous SiGe region into a crystalline titanium germanosilicide stressor layer. The contact hole is then filled with a metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
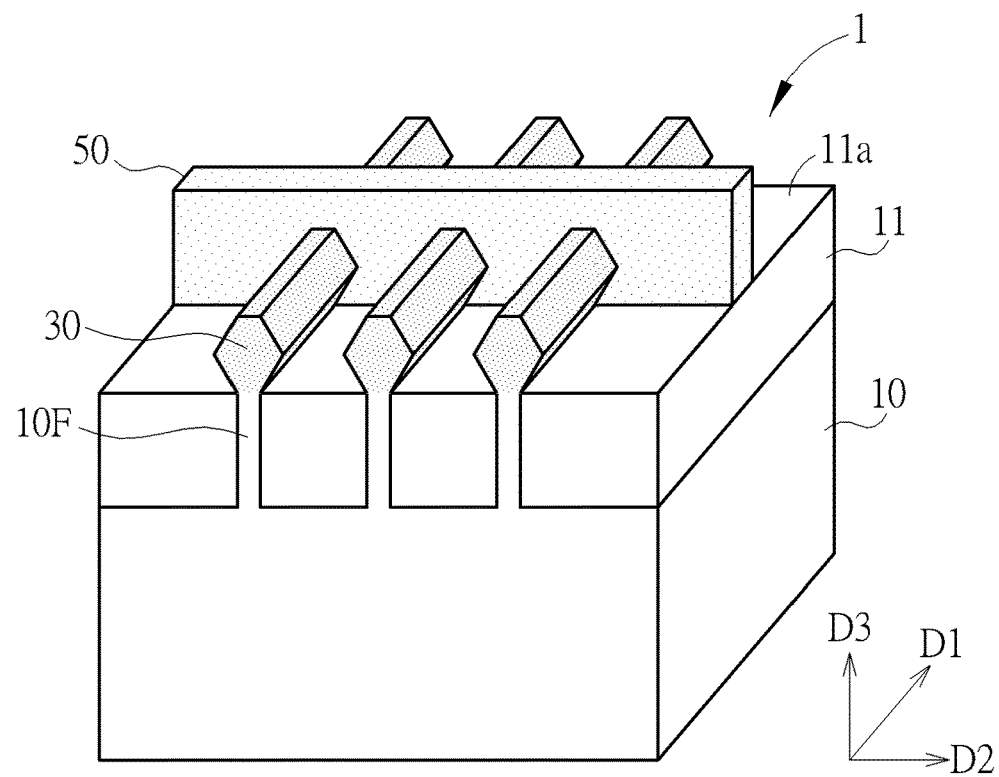
FIG. 1 is a perspective side view of a semiconductor structure in accordance with an embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Please refer to FIG. 1, which is a perspective view of a semiconductor structure 1 according to an embodiment of the invention. According to an embodiment of the invention, the semiconductor structure 1 may be a P-type fin field effect transistor (finFET). As shown in FIG. 1, a plurality of fin structures 10F extending along a first direction D1 may be formed on the semiconductor substrate 10. According to an embodiment of the invention, the bottom of the fin structure 10F is surrounded by the trench isolation structure 11, and the upper portion of the fin structure 10F protrudes from the upper surface 11a of the trench isolation structure 11. The semiconductor substrate 10 may comprise a silicon substrate, an epitaxial silicon substrate, a silicon germanium substrate, a silicon carbide substrate, or a silicon-on-insulator (SOI) substrate, but is not limited thereto.

According to an embodiment of the invention, on the fin structure 10F and the trench isolation structure 11, at least one metal gate 50 may be formed, which extends along a second direction D2, wherein the first direction D1 is perpendicular to the second direction D2. In accordance with an embodiment of the present invention, a silicon germanium (SiGe) epitaxial region 30 may be formed on the fin structure 10F on both sides of the metal gate 50. According to an embodiment of the invention, the silicon germanium (SiGe) epitaxial region 30 may be a P-type heavily doped region, which may be used as a drain or source of a P-type finFET.

It is noteworthy that, for convenience of explanation, the insulating layer covering the metal gate 50, the silicon germanium epitaxial region 30, and the trench isolation structure 11 is not shown in FIG. 1. Further, a method of forming a device structure such as a fin structure 10F, a metal gate 50, and a SiGe epitaxial region 30 on the semiconductor substrate 10 is well known, and thus details thereof will not be described herein. For example, the metal gate can be completed using a well-known replacement metal gate (RMG) process.

Figure 2:
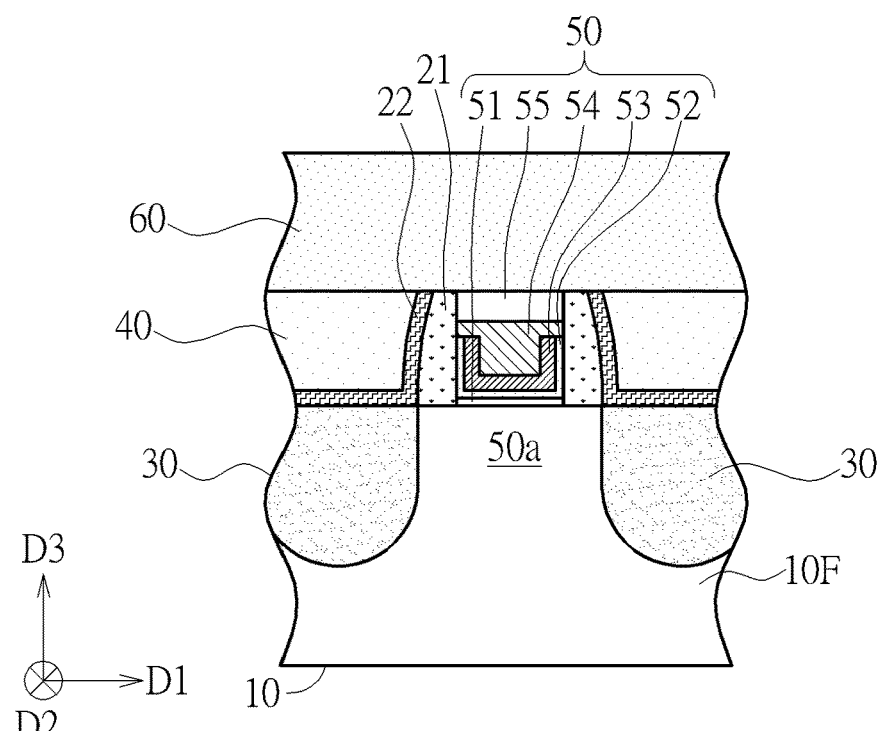
FIG. 2 to FIG. 5 are schematic cross-sectional views showing a method of fabricating a semiconductor structure according to an embodiment of the invention.

Please refer to FIG. 2 to FIG. 5, which are schematic cross-sectional views showing a method of fabricating a semiconductor structure according to an embodiment of the invention. As shown in FIG. 2, the metal gate 50 may include an interface layer 51, a high-k dielectric layer 52, a gate barrier layer 53, a work function metal layer 54, and a mask layer 55, but not limited thereto. A spacer 21 and a contact etch stop layer (CESL) 22 may be formed on the sidewall of the metal gate 50. A first dielectric layer 40 is formed on the silicon germanium epitaxial region 30. By using a planarization process, the spacer 21, the contact etch stop layer 22, the first dielectric layer 40, and the gate structure 50 can have the same height in the third direction D3 that is vertical to the semiconductor substrate 10. Then, a second dielectric layer 60 is formed to cover the gate structure 50 and the first dielectric layer 40.

According to an embodiment of the invention, the first dielectric layer 40 may comprise silicon oxide, boron-doped silicate glass (BSG), boron phosphorus-doped silicate glass (BPSG), or low dielectric constant material, and the second dielectric layer 60 may comprise silicon oxide, BSG, BPSG, low dielectric constant material, but is not limited thereto. According to an embodiment of the invention, the contact etch stop layer 22 may comprise silicon nitride, but is not limited thereto. In the fin structure 10F directly under the metal gate 50, there is a channel region 50a.

Figure 3:
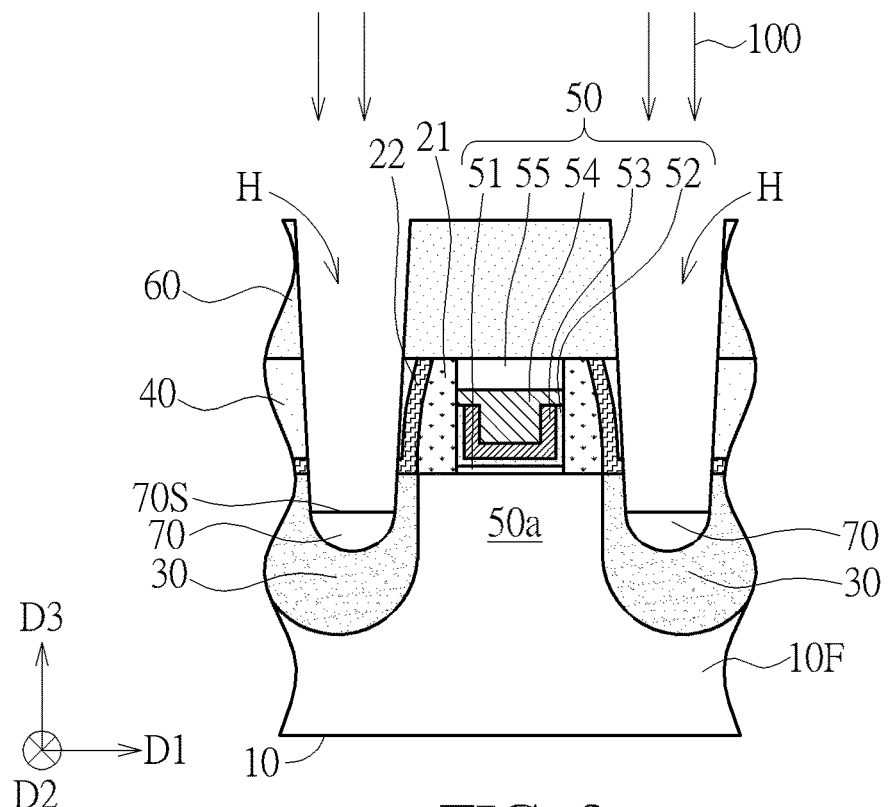

As shown in FIG. 3, a portion of the second dielectric layer 60, the first dielectric layer 40, and the contact etch stop layer 22 are then etched away to form a contact hole H. The contact hole H is formed substantially aligned with the silicon germanium epitaxial region 30, and the contact hole H exposes a portion of the corresponding silicon germanium epitaxial region 30. According to an embodiment of the invention, the contact hole H preferably penetrates through the second dielectric layer 60, the first dielectric layer 40, and the contact etch stop layer 22, and a portion of the silicon germanium epitaxial region 30 is removed by the process (e.g., etching process) for forming the contact hole H. That is, the contact hole H preferably extends partially into the silicon germanium epitaxial region 30, thereby ensuring that the silicon germanium epitaxial region 30 can be exposed by the contact hole H, but the invention is not limited thereto. In other embodiments, the contact hole H may also be stopped on the upper surface of the silicon germanium epitaxial region 30 without extending into the silicon germanium epitaxial region 30.

Subsequently, a pre-amorphization implant (PAI) process 100 can be performed, and germanium dopants are implanted into the silicon germanium epitaxial region 30 via the contact hole H, so that an amorphous silicon germanium region 70 is formed at the bottom of the contact hole H. According to an embodiment of the invention, the implantation energy of the PAI process may be between 6,000 eV and 10,000 eV, and the dose of the PAI process 100 may be between 2E13 and 2E15 atoms/cm$^2$, but is not limited thereto.

Figure 4:
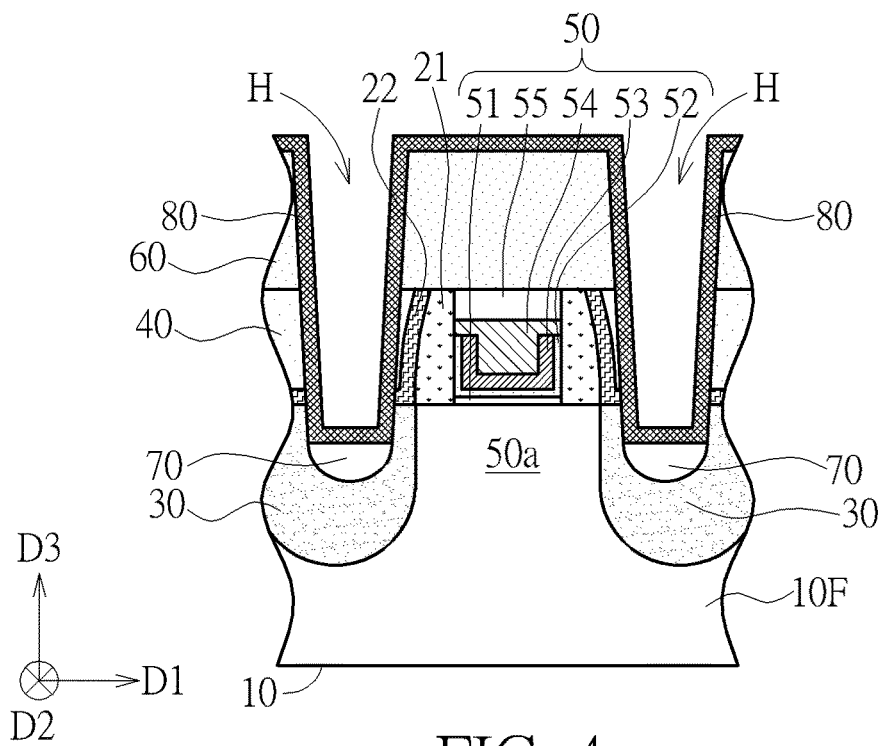

As shown in FIG. 4, a chemical vapor deposition (CVD) process or an atomic layer deposition (ALD) process may be performed to conformally deposit a titanium nitride (TiN) barrier layer 80 on the inner sidewalls and the bottom (the revealed surface of the amorphous silicon germanium region 70) of the contact hole H. The TiN barrier layer 80 is in direct contact with the amorphous silicon germanium region 70 at the bottom of the contact hole H. According to another embodiment of the present invention, a titanium/titanium nitride (Ti/TiN) barrier layer may be deposited in a conformal manner on the inner sidewalls and the bottom of the contact hole H.

Figure 5:
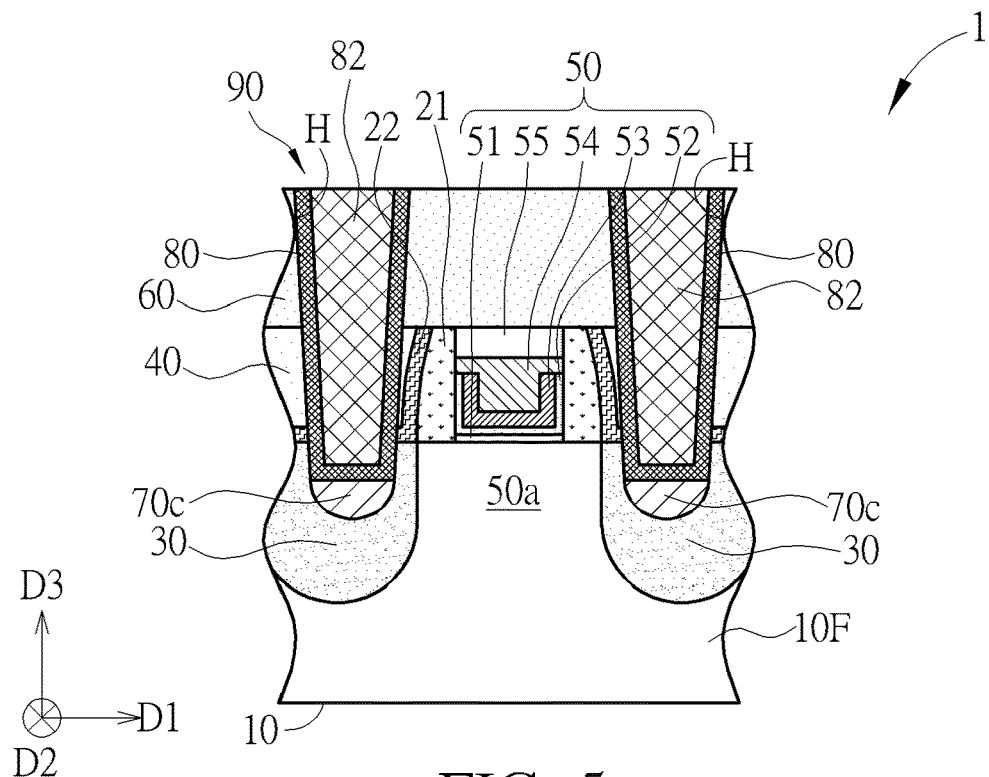

As shown in FIG. 5, an annealing process is then performed to convert at least a portion of the amorphous silicon germanium region 70 into a crystalline titanium germanosilicide stressor layer 70c. Preferably, the entire amorphous silicon germanium region 70 is converted into a crystalline titanium germanosilicide stressor layer 70c. According to an embodiment of the invention, the composition of the crystalline titanium germanosilicide stressor layer 70c may be represented by $TiSi_xGe_y$, wherein the variable x ranges, for example, between 0.1 and 2, and the variable y ranges, for example, between 0.1 and 1.5. According to an embodiment of the invention, the annealing process is a two-step rapid thermal process (RTP). For example, the two-step rapid thermal process may include: a soak rapid thermal process, performed at a fixed temperature between 500° C. and 700° C., for example, about 550° C.; and a spike rapid thermal process, performed at a peak temperature of from 500° C. to 700° C., for example, about 650 t. The above-mentioned spike rapid thermal process is successively performed after the soak rapid thermal process.

Next, a metal layer 82 is filled into the contact hole H. According to an embodiment of the invention, the metal layer 82 may comprise tungsten, but is not limited thereto. Subsequently, a chemical mechanical polishing (CMP) process may be performed to polish away the excess metal layer 82 and the TiN barrier layer 80 outside the contact hole H to form a contact structure 90.

One advantage of the present invention is that the crystalline titanium germanosilicide stressor layer 70c can induce a strain in the channel region 50a, thereby enhancing device performance. In addition, since the crystalline titanium germanosilicide stressor layer 70c is titanium rich, the contact resistance between the source/drain contact and the source/drain can be reduced. Furthermore, the formation of the crystalline titanium germanosilicide stressor layer 70c through a two-step rapid thermal process can reduce or avoid the influence on the metal gate 50.

Figure 6:
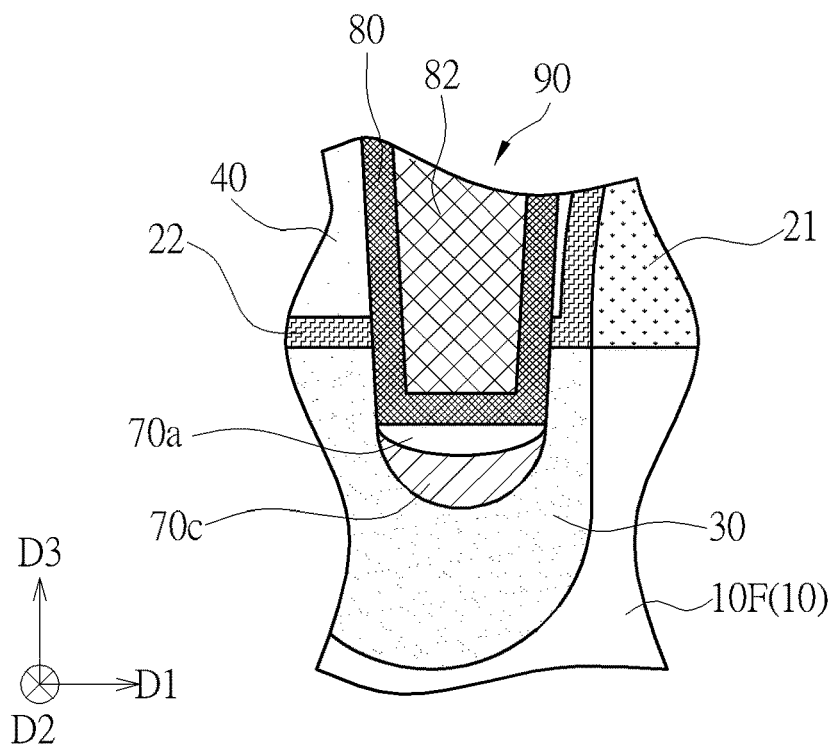
FIG. 6 is a partially enlarged cross-sectional view showing a semiconductor structure according to another embodiment of the present invention.

Please refer to FIG. 6, which is a partial cross-sectional enlarged view of a semiconductor structure 1 according to another embodiment of the invention. As shown in FIG. 6, by adjusting the annealing process, for example, reducing the annealing time or reducing the thermal budget, an amorphous titanium germanosilicide layer 70a may be formed between the TiN barrier layer 80 and the crystalline titanium germanosilicide stressor layer 70c. According to an embodiment of the present invention, for example, the germanium concentration in the crystalline titanium germanosilicide stressor layer 70c is about 10 to 50 at. %, preferably higher than 30 at. %. In the amorphous titanium germanosilicide layer 70a, the germanium concentration is about 10 to 50% at. %. According to an embodiment of the present invention, the germanium concentration in the crystalline titanium germanosilicide stressor layer 70c is higher than the germanium concentration in the amorphous titanium germanosilicide layer 70a.

Structurally, as shown in FIG. 5, a semiconductor structure 1 such as a P-type finFET includes a semiconductor substrate 10, at least a silicon germanium (SiGe) epitaxial region 30 disposed in the semiconductor substrate 10, a contact structure 90 disposed on the SiGe epitaxial region 30, and a crystalline titanium germanosilicide stressor layer 70a disposed in the SiGe epitaxial region 30. The contact structure 90 includes a titanium nitride (TiN) barrier layer 80 and a metal layer 82 surrounded by the TiN barrier layer 80. The crystalline titanium germanosilicide stressor layer is disposed between the TiN barrier layer 80 and the SiGe epitaxial region 30. The semiconductor substrate 10 comprises a fin structure 10F. The SiGe epitaxial region 30 is disposed on the fin structure 10F. A metal gate 50 is disposed on the fin structure 10F and is adjacent to the contact structure 90 and the SiGe epitaxial region 30. A channel region 50a is in the fin structure 10F directly under the metal gate 50.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a semiconductor substrate;
   at least a silicon germanium (SiGe) epitaxial region disposed in the semiconductor substrate;
   a contact structure disposed on the SiGe epitaxial region, wherein the contact structure comprises a titanium nitride (TiN) barrier layer and a metal layer surrounded by the TiN barrier;
   a crystalline titanium germanosilicide stressor layer disposed in the SiGe epitaxial region and between the TiN barrier layer and the SiGe epitaxial region; and
   an amorphous titanium germanosilicide layer between the TiN barrier layer and the crystalline titanium germanosilicide stressor layer.

2. The semiconductor structure according to claim 1, wherein a germanium concentration of the crystalline titanium germanosilicide stressor layer is higher than that of the amorphous titanium germanosilicide layer.

3. The semiconductor structure according to claim 1, wherein the semiconductor structure is a P-type finFET.

4. The semiconductor structure according to claim 1, wherein the metal layer comprises tungsten.

5. The semiconductor structure according to claim 1, wherein the semiconductor substrate comprises a fin structure.

6. The semiconductor structure according to claim 5, wherein the SiGe epitaxial region is disposed on the fin structure.

7. The semiconductor structure according to claim 6 further comprising:
   a metal gate disposed on the fin structure and is adjacent to the contact structure and the SiGe epitaxial region; and
   a channel region in the fin structure directly under the metal gate.

8. The semiconductor structure according to claim 7 further comprising:
   a gate dielectric layer between the metal gate and the channel region.

9. The semiconductor structure according to claim 7, wherein the crystalline titanium germanosilicide stressor layer induces strain in the channel region.

10. A method for forming a semiconductor structure, comprising:
    providing a semiconductor substrate;
    forming at least a silicon germanium (SiGe) epitaxial region in the semiconductor substrate;
    depositing a dielectric layer over the SiGe epitaxial region and the semiconductor substrate;
    forming a contact hole in the dielectric layer, wherein the contact hole exposes a part of the SiGe epitaxial region;
    implanting germanium dopants into the SiGe epitaxial region through the contact hole thereby forming an amorphous SiGe region at a bottom of the contact hole;
    conformally depositing a TiN barrier layer on an interior sidewall and the bottom of the contact hole;
    performing an annealing process to transform at least a part of the amorphous SiGe region into a crystalline titanium germanosilicide stressor layer; and
    filling the contact hole with a metal layer.

11. The method according to claim 10, wherein the TiN barrier layer is in direct contact with the amorphous SiGe region.

12. The method according to claim 10, wherein the metal layer comprises tungsten.

13. The method according to claim 10, wherein the annealing process is a two-step rapid thermal process.

14. The method according to claim 13, wherein the two-step rapid thermal process comprises:
    a soak rapid thermal process performed at a fixed temperature of about 550° C.; and
    a spike rapid thermal process performed at peak temperature of about 650° C.

15. The method according to claim 14, wherein the spike rapid thermal process is performed successively after the soak rapid thermal process.

16. The method according to claim 10, wherein the semiconductor substrate comprises a fin structure and the SiGe epitaxial region is disposed in the fin structure.

17. The method according to claim 16 further comprising:
    forming a metal gate on the fin structure and adjacent to the SiGe epitaxial region.

18. The method according to claim 10 further comprising:
    forming an amorphous titanium germanosilicide layer between the TiN barrier layer and the crystalline titanium germanosilicide stressor layer.

19. The method according to claim 18, wherein a germanium concentration of the crystalline titanium germanosilicide stressor layer is higher than that of the amorphous titanium germanosilicide layer.

* * * * *